US 10,797,807 B2

(12) United States Patent
Vella-Coleiro

(10) Patent No.: US 10,797,807 B2
(45) Date of Patent: Oct. 6, 2020

(54) METHODS FOR CALIBRATING MILLIMETER WAVE ANTENNA ARRAYS

(71) Applicant: CommScope Technologies LLC, Hickory, NC (US)

(72) Inventor: George P. Vella-Coleiro, Summit, NJ (US)

(73) Assignee: CommScope Technologies LLC, Hickory, NC (US)

( * ) Notice: Subject to any disclaimer, the term of this patent is extended or adjusted under 35 U.S.C. 154(b) by 0 days.

(21) Appl. No.: 16/639,709

(22) PCT Filed: Sep. 18, 2018

(86) PCT No.: PCT/US2018/051475
§ 371 (c)(1),
(2) Date: Feb. 17, 2020

(87) PCT Pub. No.: WO2019/060287
PCT Pub. Date: Mar. 28, 2019

(65) Prior Publication Data
US 2020/0220628 A1    Jul. 9, 2020

Related U.S. Application Data

(60) Provisional application No. 62/560,712, filed on Sep. 20, 2017.

(51) Int. Cl.
*G01R 31/08* (2020.01)
*H04B 17/12* (2015.01)
*H04B 17/21* (2015.01)
*H04B 17/318* (2015.01)
*G01R 29/10* (2006.01)
*H01Q 3/24* (2006.01)

(52) U.S. Cl.
CPC .......... *H04B 17/12* (2015.01); *G01R 29/105* (2013.01); *H01Q 3/247* (2013.01); *H04B 17/21* (2015.01); *H04B 17/318* (2015.01)

(58) Field of Classification Search
None
See application file for complete search history.

(56) References Cited

U.S. PATENT DOCUMENTS

| | | | |
|---|---|---|---|
| 9,553,363 B2 | 1/2017 | Allen et al. | |
| 10,310,073 B1 * | 6/2019 | Santra | H04N 21/44218 |
| 2006/0158369 A1 * | 7/2006 | Shinoda | G01S 13/931 342/70 |

(Continued)

OTHER PUBLICATIONS

International Search Report and Written Opinion of the International Searching Authority, International Application No. PCT/US2018/051475, dated Nov. 21, 2018, 11 pp.

(Continued)

*Primary Examiner* — Gerald A Smarth
(74) *Attorney, Agent, or Firm* — Myers Bigel, P.A.

(57) ABSTRACT

Methods are provided for calibrating a millimeter wave active antenna array using over-the-air measurements and an optimization algorithm. The transmit and receive paths may be optimized separately, and the optimization may be performed on the magnitude and phase separately or together. The parameter optimized may include the received power of the main lobe or the received power at the location of a null in some embodiments.

18 Claims, 6 Drawing Sheets

(56) References Cited

U.S. PATENT DOCUMENTS

| | | | |
|---|---|---|---|
| 2007/0159407 A1 | 7/2007 | Bolle et al. | |
| 2009/0219903 A1 | 9/2009 | Alamouti et al. | |
| 2009/0237092 A1* | 9/2009 | Zoughi | H01Q 21/064 324/637 |
| 2011/0006949 A1 | 1/2011 | Webb | |
| 2012/0119952 A1 | 5/2012 | Pozgay et al. | |
| 2013/0171946 A1 | 7/2013 | Veihl et al. | |
| 2014/0266901 A1 | 9/2014 | Klemes | |
| 2014/0300519 A1 | 10/2014 | Estebe et al. | |
| 2015/0349421 A1* | 12/2015 | Sharawi | H01Q 21/065 342/373 |
| 2016/0112970 A1* | 4/2016 | Chen | H04B 7/0617 455/522 |
| 2017/0207545 A1 | 7/2017 | Miraftab et al. | |
| 2018/0323834 A1* | 11/2018 | Jiang | G01S 3/40 |
| 2018/0331420 A1 | 11/2018 | Brobston et al. | |
| 2019/0253181 A1* | 8/2019 | Rahman | H04L 1/0008 |

OTHER PUBLICATIONS

Hestenes et al., "Methods of Conjugate Gradients for Solving Linear Systems", Journal of Research of the National Bureau of Standards, vol. 49, No. 6, Dec. 1952, pp. 409-436.

Kennedy et al., "Particle Swarm Optimization", Proceedings of IEEE International Conference on Neural Networks (ICNN '95), Nov. 27-Dec. 1, 1995, pp. 1942-1948.

Yang, "A New Metaheuristic Bat-inspired Algorithm", Nature Inspired Cooperative Strategies for Optimization (NISCO 2010), Eds. J.R. Gonzales et al., Studies in Computational Intelligence, Springer Berlin, 284, 2010, pp. 65-74.

\* cited by examiner

METHODS FOR CALIBRATING MILLIMETER WAVE ANTENNA ARRAYS

CROSS-REFERENCE TO RELATED APPLICATIONS

The present application is a 35 U.S.C. § 371 national stage application of PCT Application No. PCT/US2018/051475, filed on Sep. 18, 2018, which itself claims priority to U.S. Provisional Patent Application Ser. No. 62/560,712, filed on Sep. 20, 2017, the entire contents of both of which are incorporated herein by reference as if set forth in their entireties. The above-referenced PCT Application was published in the English language as International Publication No. WO 2019/060287 A1 on Mar. 28, 2019.

FIELD

The present invention relates to communications systems and, more particularly, to wireless communications systems that operate in the millimeter wave spectrum.

BACKGROUND

Wireless radio frequency ("RF") communications systems, such as cellular communications systems, WiFi networks, microwave backhaul systems and the like, are well known in the art. Some of these systems, such as cellular communication systems, operate in the so-called "licensed" frequency spectrum where use of the frequency band is carefully regulated so that only specific users in any given geographical region can operate in selected portions of the frequency band to avoid interference, while other systems such as WiFi operate in the "unlicensed" frequency spectrum which is available to all users, albeit typically with limits on transmit power to reduce interference.

Cellular communications systems are now widely deployed. In a typical cellular communications system, a geographic area is divided into a series of regions that are referred to as "cells," and each cell is served by a base station. The base station may include baseband equipment, radios and antennas that are configured to provide two-way RF communications with fixed and mobile subscribers that are positioned throughout the cell. The base station antennas generate radiation beams ("antenna beams") that are directed outwardly to serve the entire cell or a portion thereof. Typically, a base station antenna includes one or more phase-controlled arrays of radiating elements.

There has been a rapid increase in the demand for wireless communications, with many new applications being proposed in which wireless communications will replace communications that were previously carried over copper or fiber optic communications cables. Conventionally, most wireless communications systems operated at frequencies below 6.0 GHz, with a few notable exceptions such as microwave backhaul systems, various military applications and the like. As capacity requirements continue to increase, the use of higher frequencies is being considered, including frequencies in both the licensed and unlicensed spectrum. As higher frequencies are considered, the millimeter wave spectrum, which includes frequencies from approximately 25 GHz to as high as about 300 GHz, is a potential candidate, as there are large contiguous frequency bands in this frequency range that are potentially available for new applications. The use of cellular technology has also been contemplated for so-called "fixed wireless access" applications such as connecting cable television or other optical fiber, coaxial cable or hybrid coaxial cable-fiber optic broadband networks to individual subscriber premises over wireless "drop" links. There currently is interest in potentially deploying communications systems that operate in the 28 GHz to 60 GHz (or even higher) frequency range for such fixed wireless access applications using fifth generation ("5G") cellular communications technology.

SUMMARY

Pursuant to embodiments of the present invention, methods of calibrating an active antenna array are provided in which first magnitude and phase settings are determined for each of a plurality of sub-arrays of the active antenna array, wherein the first magnitude and phase settings are configured to generate a radiation pattern having a main lobe that points in a first direction with respect to a boresight pointing direction of the active antenna array. A first millimeter wave signal is transmitted through the active antenna array using the first set of magnitude and phase settings. A received power of the transmitted first millimeter wave signal at a first location is determined. An optimization algorithm is used to determine second magnitude and phase settings for each of the plurality of sub-arrays of the active antenna array. A second millimeter wave signal is transmitted through the active antenna array using the second magnitude and phase settings. Finally, a received power of the transmitted second millimeter wave signal at a second location is determined.

In some embodiments, the first location is within the main lobe of the radiation pattern. The second location may be the same as the first location in some embodiments. The optimization algorithm may be configured to identify a set of magnitude and phase settings for each of the plurality of sub-arrays of the active antenna array that increase the received power of millimeter wave signals transmitted by the active antenna array at the first location as compared to the determined received power of the first millimeter wave signal.

In some embodiments, the first location is not along a vector extending from the active antenna array along the first direction. For example, the first location may be in a direction of a desired null in the radiation pattern. The optimization algorithm may be configured to identify a set of magnitude and phase settings for each of the plurality of sub-arrays of the active antenna array that decrease the received power of millimeter wave signals transmitted by the active antenna array at the first location as compared to the determined received power of the first millimeter wave signal.

In some embodiments, the method may further include using the optimization algorithm to determine additional sets of magnitude and phase settings, each additional set including magnitude and phase settings for each of the plurality of sub-arrays of the active antenna array, and for each of the additional sets of magnitude and phase settings, transmitting an additional millimeter wave signal through the active antenna array that is generated using the additional set of magnitude and phase settings and determining the received power from each additional transmitted millimeter wave signal at the first location. The method may also include identifying the set of magnitude and phase settings that has either the highest or lowest received power level for a millimeter wave signal transmitted from the active antenna array at a location along the first direction.

In some embodiments, the optimization algorithm may be one of a conjugate gradient optimization algorithm, a particle swarm optimization algorithm or a bat optimization algorithm. In some embodiments, a center frequency of the first millimeter wave signal may be between 15 GHz and 90 GHz. In some embodiments, each of the sub-arrays may include a single radiating element.

In some embodiments, using an optimization algorithm to determine second magnitude and phase settings for each of the plurality of sub-arrays of the active antenna array may comprise using an optimization algorithm that varies either the magnitude settings for each of the plurality of sub-arrays or the phase settings for each of the plurality of sub-arrays to provide the second magnitude and phase settings for each of the plurality of sub-arrays of the active antenna array. In some embodiments, using an optimization algorithm to determine second magnitude and phase settings for each of the plurality of sub-arrays of the active antenna array may include inputting the determined received power of the transmitted first millimeter wave signal at a first location into the optimization algorithm.

Pursuant to further embodiments of the present invention, methods of field calibrating an active antenna array are provided in which first magnitude and phase settings are determined for each of a plurality of sub-arrays of the active antenna array that are configured to generate a radiation pattern having a main lobe that points in a first direction with respect to a boresight pointing direction of the active antenna array. A first millimeter wave signal is transmitted through the active antenna array using the first magnitude and phase settings. A first signal that includes a received power level of the first millimeter wave signal is received at a receiver. An optimization algorithm is used to determine second magnitude and phase settings for each of the plurality of sub-arrays of the active antenna array. A second millimeter wave signal is transmitted through the active antenna array using the second set of magnitude and phase settings. A second signal is received that includes a received power level of the second millimeter wave signal at the receiver. The optimization algorithm is then used to determine additional sets of magnitude and phase settings, each additional set of magnitude and phase settings including magnitude and phase settings for each of the plurality of sub-arrays of the active antenna array, transmitting additional millimeter wave signals through the active antenna array using respective ones of the determined additional sets of magnitude and phase settings, and receiving additional signals from the receiver that include received power levels of the respective additional millimeter wave signals at the receiver until the optimization algorithm identifies a set of magnitude and phase settings for each of the plurality of sub-arrays of the active antenna array that maximize a received power level of millimeter wave signals transmitted by the active antenna array at the receiver.

In some embodiments, the optimization algorithm is configured to identify a set of magnitude and phase settings for each of the plurality of sub-arrays of the active antenna array that increase the received power of millimeter wave signals transmitted by the active antenna array at the receiver as compared to the determined received power of the first millimeter wave signal.

In some embodiments, the optimization algorithm is one of a conjugate gradient optimization algorithm, a particle swarm optimization algorithm or a bat optimization algorithm.

In some embodiments, a center frequency of the first millimeter wave signal is between 15 GHz and 90 GHz.

Pursuant to still further embodiments of the present invention, methods of calibrating an active antenna array are provided in which a series of test millimeter wave signals are transmitted through the active antenna array that are received at a receiver that is located in a fixed relationship with respect to the active antenna array. An optimization algorithm is used to select at least some of a plurality of magnitude and/or phase settings that are applied to sub-components of the test millimeter wave signals that are transmitted through the active antenna array. The optimization algorithm is configured to identify magnitude and/or phase settings that either maximize or minimize a received power level of a millimeter wave signal that is transmitted by the active antenna array at a location of the receiver.

Pursuant to still further embodiments of the present invention, methods of calibrating an active antenna array are provided in which first magnitude and phase settings are determined for each of a plurality of sub-arrays of the active antenna array wherein the first magnitude and phase settings are configured to generate a radiation pattern having a main lobe that points in a first direction with respect to a boresight pointing direction of the active antenna array. A first millimeter wave signal is received at the active antenna array using the first set of magnitude and phase settings. A received power of the first millimeter wave signal is determined. An optimization algorithm is used to determine second magnitude and phase settings for each of the plurality of sub-arrays of the active antenna array. A second millimeter wave signal is received at the active antenna array using the second magnitude and phase settings, where both the first millimeter wave signal and the second millimeter wave signal are transmitted to the active antenna array from a first location. A received power of the second millimeter wave signal is determined.

In some embodiments, the first location is within the main lobe of the radiation pattern.

In some embodiments, the optimization algorithm may be configured to identify a set of magnitude and phase settings for each of the plurality of sub-arrays of the active antenna array that increase the received power of millimeter wave signals received at the active antenna array from a source at the first location as compared to the determined received power of the first millimeter wave signal.

In some embodiments, the first location is not along a vector extending from the active antenna array along the first direction.

In some embodiments, the optimization algorithm is configured to identify a set of magnitude and phase settings for each of the plurality of sub-arrays of the active antenna array that decrease the power of millimeter wave signals received at the active antenna array from a source at the first location as compared to the determined received power of the first millimeter wave signal.

In some embodiments, the method further includes comprising using the optimization algorithm to determine additional sets of magnitude and phase settings, each additional set including magnitude and phase settings for each of the plurality of sub-arrays of the active antenna array, and for each of the additional sets of magnitude and phase settings, receiving an additional millimeter wave signal that is transmitted from the first location at the active antenna array using the additional set of magnitude and phase settings and determining the received power of each additional received millimeter wave signal.

In some embodiments, the method further includes identifying the set of magnitude and phase settings corresponding to the one of the additional received millimeter wave signals that has the highest or lowest received power level.

DETAILED DESCRIPTION

Figure 1A:
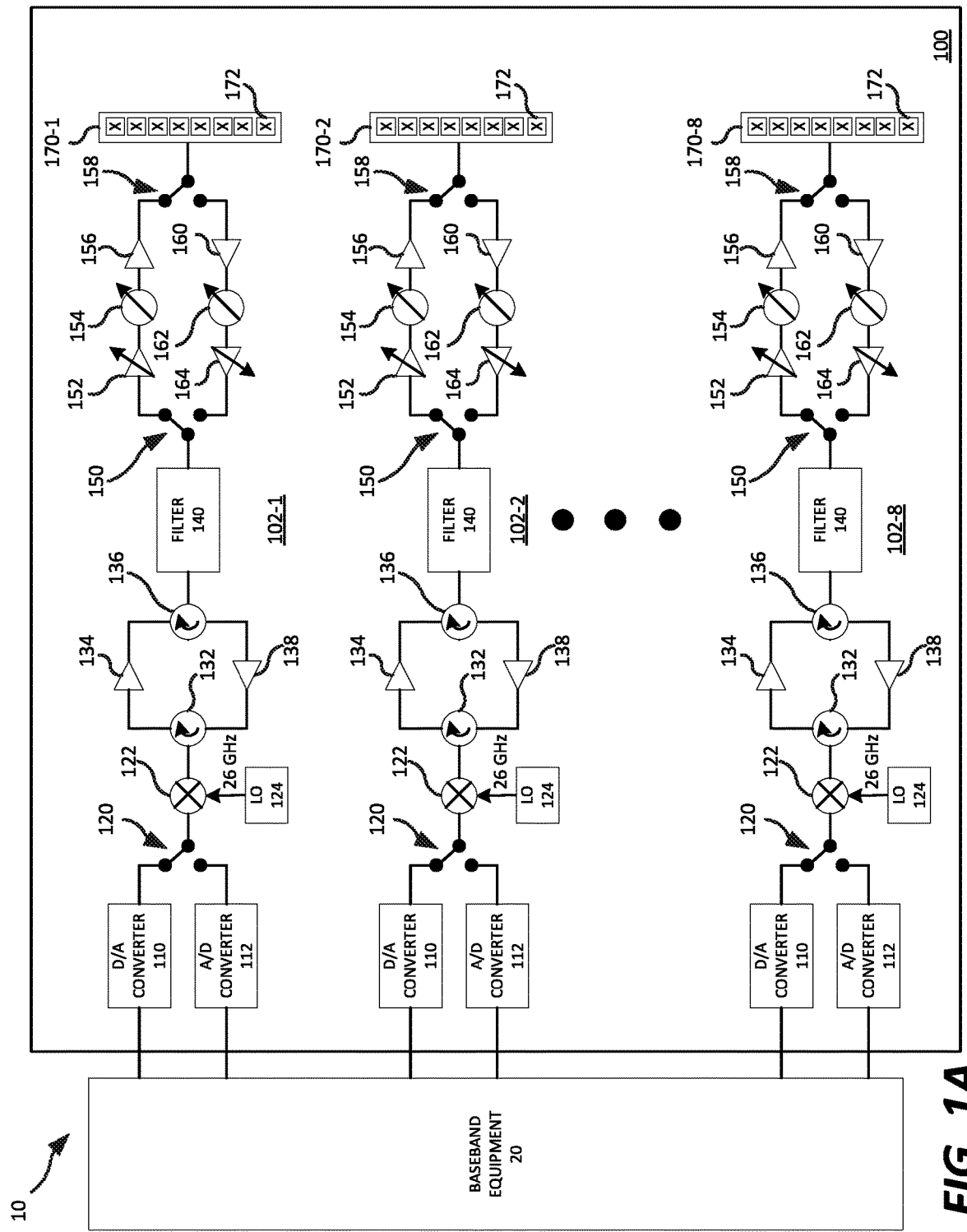
FIG. 1A is a schematic diagram of a millimeter wave communications system that includes an active antenna array that is configured for RF beamforming.

Phased array antennas are used in a wide variety of wireless communications systems. The size of the radiating elements in a phased array antenna, and the distance between adjacent radiating elements, are typically proportional to the "operating" frequency at which the radiating elements are designed to transmit and receive signals, with higher operating frequencies corresponding to smaller radiating elements and the radiating elements being spaced closer together. At frequencies below 1 GHz, dipole radiating elements may be 4-8 inches long. At 60 GHz, the radiating elements may be sixty times smaller. When the radiating elements are this small, it may be possible to form the radiating elements on the same wiring boards (or other mounting substrates or structures) as active components of the communications system (e.g., transceivers, amplifiers and the like). In some cases, it may even be possible to form the radiating elements and the active components (e.g., amplifiers, mixers, local oscillators, etc.) on the same semiconductor integrated circuit chip, resulting in a compact, low cost, and easily assembled device. Implementing the active components and the radiating elements on the same mounting substrate may also reduce or eliminate the need for cables and connectors. This may be advantageous as cabling connections add cost, introduce transmission losses and increase manufacturing complexity, and can also be sources of passive intermodulation distortion and antenna failures (e.g., bad solder joints, broken connections, etc.).

Another important consideration that impacts the use of the millimeter wave spectrum for high speed wireless data communications is that the free space propagation loss increases dramatically with increasing frequency. To compensate for the large propagation loss, the antennas that operate in the millimeter wave spectrum are often designed to generate narrow, high gain antenna beams that may be pointed directly at users, as is allowed in fifth generation ("5G") cellular communications systems. A practical method to create such narrow antenna beams is to use a two-dimensional array having a relatively large number of radiating elements. By having both rows and columns of radiating elements, it is possible to narrow the beamwidth of the antenna beam generated by the array in both the azimuth and elevation planes. A separate transceiver (radio) may be provided for each radiating element in the two-dimensional array (or for individual sub-groups of radiating elements called "sub-arrays") to provide full phase distribution control (i.e., the transceivers may act in coordinated fashion to transmit the same RF signal during any given time slot, with the amplitude and/or phase of the sub-components of the RF signal output by the different transceivers manipulated to generate the directional pencil beam radiation pattern).

The phased array antenna is designed so that the magnitudes and phases of the signals radiated from each individual radiating element may be adjusted. Each radiating element may be fed a sub-component of a millimeter wave signal that is to be transmitted, where the magnitude and phase of each sub-component are set so that the signals radiated from each radiating element in the phased array add coherently in a desired direction. The magnitude and phase settings may be adjusted to allow the main lobe of antenna beam to be steered over a wide geographic area. Typically, adjustable attenuators and phase shifters are used to dynamically adjust the magnitudes and phases of the sub-components of the signal that are radiated from each radiating element. Unfortunately, the adjustable attenuators, adjustable phase shifters, transmission lines and various other circuit components, even when carefully designed and manufactured, will not be perfectly matched. For example, when first and second adjustable phase shifters are each programmed to apply a 25° phase shift, the first phase shifter may actually apply a phase shift of 28° while the second phase shifter may apply a phase shift of 24° due to manufacturing variations. These manufacturing variations are expected to introduce phase variations of, for example, +/−5° and amplitude variations of +/−2 dB. Amplitude and phase errors of this magnitude in the sub-components of the signal that are transmitted by each radiating element degrade the degree to which the individual radiating elements constructively combine to form a narrow, high gain antenna beam in the direction of a user. The effect of these imperfections may be reduced by calibrating the adjustable phase shifters, attenuators and other circuit components to compensate for mismatches.

Pursuant to embodiments of the present invention, methods are provided for calibrating a millimeter wave active antenna array using over-the-air measurements and an optimization algorithm. In some embodiments of these methods, the phase and magnitude adjustments may be made at RF (e.g., the transmission frequency). In other embodiments, the phase and magnitude adjustments can be made digitally at baseband. In still other embodiments, the phase and magnitude adjustments can be made partially digitally at baseband and partially at RF.

According to some embodiments of these calibration methods, a first set of magnitudes and phase settings is determined, the first set of magnitude and phase settings including magnitude and phase settings for each of a plurality of sub-arrays of the active antenna array. The first set of magnitudes and phase settings is configured to generate a radiation pattern (i.e., an antenna beam) that has a main lobe that points in a first direction with respect to a boresight pointing direction of the active antenna array. A first millimeter wave signal is then transmitted through the active antenna array using the first set of magnitude and phase settings. A received power of the transmitted first millimeter wave signal at a first location is then determined. An optimization algorithm is then used to determine a second set of magnitude and phase settings, the second set of magnitude and phase settings including magnitude and phase settings for each of the plurality of sub-arrays. A second millimeter wave signal is then transmitted through the active antenna array using the second set of magnitude and phase settings. A received power of the transmitted second millimeter wave signal at a second location is then determined.

In some embodiments, the first location may be within the main lobe of the radiation pattern. In such embodiments, the optimization algorithm may be configured to identify a set of magnitude and phase settings that includes magnitude and phase settings for each of the plurality of sub-arrays of the active antenna array that maximizes the received power of millimeter wave signals transmitted by the active antenna array at the first location, or that at least increases the received power as compared to the received power of the first millimeter wave signal. In other embodiments, the first location may be spaced-apart from a vector extending from the active antenna array along the first direction such as a location that is in a direction of a desired null in the radiation pattern. In these embodiments, the optimization algorithm may be configured to select sets of magnitude and phase settings for the sub-arrays of the active antenna array that decrease or minimize the received power of millimeter wave signals transmitted by the active antenna array at the first location while maintaining the power in the main lobe.

The optimization algorithm may continue to be used to determine additional sets of magnitude and phase settings for the plurality of sub-arrays of the active antenna array. An additional millimeter wave signal may be transmitted through the active antenna array using the additional set of magnitude and phase settings and the received power from each additional transmitted millimeter wave signal at the first location in order to identify a set of magnitude and phase settings that either maximize or minimize a received power level of millimeter wave signals transmitted from the active antenna array at locations along the first direction.

Pursuant to further embodiments of the present invention, methods of field calibrating an active antenna array are provided. Pursuant to these methods, first magnitude and phase settings are determined for each of a plurality of sub-arrays of the active antenna array, where the first magnitude and phase settings are configured to generate a radiation pattern having a main lobe that points in a first direction with respect to a boresight pointing direction of the active antenna array. A first millimeter wave signal is transmitted through the active antenna array using the first magnitude and phase settings. A first signal is received that includes a received power level of the first millimeter wave signal at a receiver. An optimization algorithm is used to determine second magnitude and phase settings for each of the plurality of sub-arrays of the active antenna array. A second millimeter wave signal is transmitted through the active antenna array using the second set of magnitude and phase settings. A second signal is received that includes a received power level of the second millimeter wave signal at the receiver. The optimization algorithm is then used to (1) determine additional sets of magnitude and phase settings, each additional set of magnitude and phase settings including magnitude and phase settings for each of the plurality of sub-arrays of the active antenna array, (2) transmit additional millimeter wave signals through the active antenna array using respective ones of the determined additional sets of magnitude and phase settings, and (3) receive additional signals that include received power levels of the respective additional millimeter wave signals at the receiver until the optimization algorithm identifies a set of magnitude and phase settings for each of the plurality of sub-arrays of the active antenna array that maximizes a received power level of millimeter wave signals transmitted by the active antenna array at the receiver.

Pursuant to still further embodiments of the present invention, methods of calibrating an active antenna array are provided in which a series of test millimeter wave signals is transmitted through the active antenna array that are received at a receiver that is located in a fixed relationship with respect to the active antenna array. An optimization algorithm is used to select at least some of a plurality of magnitude and/or phase settings that are applied to sub-components of the test millimeter wave signals that are transmitted through the active antenna array. The optimization algorithm is configured to identify magnitude and/or phase settings that either maximize or minimize a received power level of a millimeter wave signal that is transmitted by the active antenna array at a location of the receiver.

Embodiments of the present invention will now be described in greater detail with reference to the attached drawings.

Figure 1B:
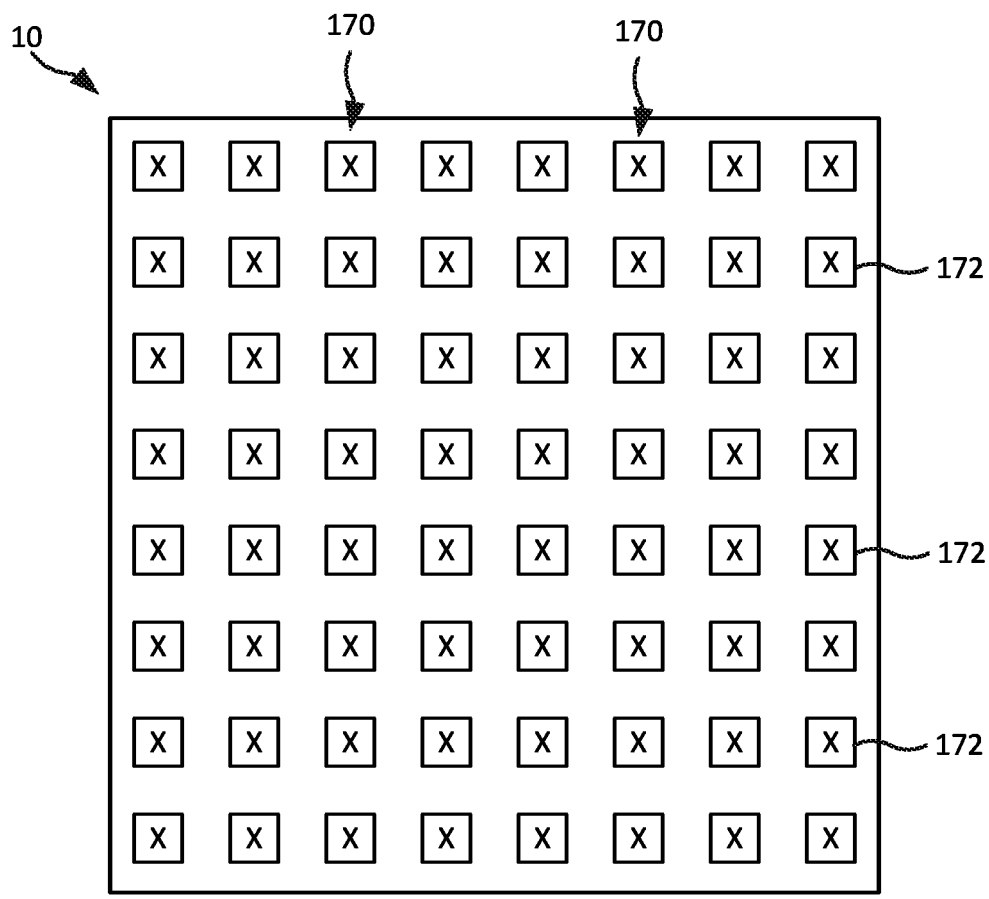
FIG. 1B is a schematic front view of the active antenna array of FIG. 1A.

FIG. 1A is a schematic block diagram of a millimeter wave communications system 10 that includes baseband equipment 20 and a millimeter wave active phased array antenna (also referred to herein as an "active antenna array") 100. As shown in FIG. 1A, the active antenna array 100 includes a plurality of radiating elements 172. FIG. 1B is a front view of the active antenna array 100 of FIG. 1A that illustrates an example configuration of the active antenna array 100 in which the radiating elements 172 thereof are arranged in a two dimensional array.

Referring first to FIG. 1A, the active antenna array 100 may be connected to the baseband equipment 20. The active antenna array 100 may or may not be co-located with the baseband equipment 20. The baseband equipment 20 may perform functions such as digital coding, equalization and synchronization on data that is to be transmitted by the active antenna array 100 or that is received by the active antenna array 100. The baseband equipment 20 may include an interface to a backhaul network (not shown).

Baseband data (e.g., digital data in a 100 MHz frequency band centered at 0 Hz) may be received from the baseband equipment 20 and fed a plurality of transmit/receive paths 102-1 through 102-8 through active antenna array 100. Each transmit/receive path 102 includes to a digital-to-analog ("D/A") converter 110. The digital-to-analog converter 110 may convert the digital data received from the baseband equipment 20 into an intermediate frequency analog signal. In an example embodiment, the intermediate frequency signal may be a 2 GHz signal, but it will be appreciated that any suitable intermediate frequency may be used, or that the output of the digital-to-analog converter 110 may be at baseband. The analog signal output by digital-to-analog converter 110 is fed to a first transmit/receive switch 120. The first transmit/receive switch 120 is provided because 5G cellular communications systems typically are time division multiplexed systems where different users or sets of users may be served during different time slots, and in many cases the same frequencies (but different time slots) may be used for transmitting and receiving signals. For example, each 10 millisecond period (or some other suitable small period of time) may represent a "frame" that is further divided into dozens or hundreds of individual time slots. Each user may be assigned one or more of the time slots and the millimeter wave communications system 10 may be configured to communicate with the different users during their individual time slots of each frame. With full two-dimensional beam-steering, the millimeter wave active antenna array 100 may generate small, highly-focused antenna beams on a time slot-by-time slot basis. The magnitudes and phases of the sub-components of the millimeter wave signal that are fed to each radiating element (or to groups of radiating elements) may be adjusted in order to steer the narrow antenna beam so that it points at different users during each respective time slot.

Referring again to FIG. 1A, the transmit/receive switch 120 may be set either to feed data to be transmitted down a transmit signal path that extends between the digital-to-analog converter 110 and the radiating elements 172 or to feed signals received at the radiating elements 172 down a receive signal path that extends between the radiating elements 172 and an analog-to-digital converter 112. Focusing first on the transmit signal path, a signal to be transmitted (e.g., an IF signal output by digital-to-analog converter 110) is passed through the transmit/receive switch 120 and input to an up/down converter 122. The up/down converter 122 may receive a higher frequency signal from a local oscillator 124 such as, for example, a 26 GHz local oscillation signal. The up/down converter 122 may multiply the 2 GHz data signal output through the transmit/receive switch 120 by the 26 GHz local oscillation signal to up-convert the 2 GHz intermediate frequency signal to 28 GHz. This 28 GHz signal may be output by the up/down converter 122 to a first circulator 132 (or, alternatively, another transmit/receive switch). The first circulator 132 routes the 28 GHz signal to an amplifier 134 that boosts the signal to a level appropriate for driving the power amplifier 156. The output of the amplifier 134 is fed to a second circulator 136 (or, alternatively, another transmit/receive switch) which feeds the 28 GHz signal to a filter 140.

The filter 140 may comprise a bandpass filter that filters out intermodulation products generated at the up/down converter 122. For example, the filter 140 may comprise a 28 GHz bandpass filter. The filtered 28 GHz signal output by filter 140 is fed to a second transmit/receive switch 150. The second transmit/receive switch 150 passes the signal to a variable attenuator 152 that may be used to reduce the magnitude of the transmit signal. The variable attenuator 152 may comprise, for example, a variable resistor that has a plurality of different resistance values that can be selected by application of a control signal. Each variable attenuator 152 may thus be used to reduce the magnitude of a signal supplied thereto by an amount determined by a control signal provided to the variable attenuator 152. The signal output by the variable attenuator 152 is passed to a variable phase shifter 154 that may be used to modify the phase of the 28 GHz transmit signal. The variable phase shifter 154 may comprise, for example, an integrated circuit chip that may adjust the phase of a millimeter wave signal input thereto. A control signal supplied to the variable phase shifter 154 may select one of a plurality of phase shifts. The output of the variable phase shifter 154 is passed to a high power amplifier 156 that amplifies the signal to an appropriate transmit level. The amplified transmit signal is then passed through a third transmit/receive switch 158 to, for example, a radiating element 172 (or to a sub-array 170 of radiating elements 172) for over-the-air transmission. In the example of FIGS. 1A-1B, each amplified transmit signal is passed to a sub-array 170 that includes eight radiating elements 172. When a sub-array 170 of radiating elements 172 is fed by one of the paths 102 of active antenna array 100, a splitter/combiner network (not shown) may split the signal to be transmitted into a plurality of sub-components, and a respective sub-component may be fed to each of the radiating elements 172 of the sub-array 170. Note that as used herein references to "sub-arrays" of radiating elements encompass sub-arrays that include a single radiating element.

When operating in receive mode, sub-components of a millimeter wave signal (e.g., a 28 GHz signal) may be received at each of the radiating elements 172 of each sub-array 170. The above-mentioned splitter/combiner network (not shown) that may be part of each sub-array 170 may combine the sub-components of the signal received at the radiating elements 172 of each sub-array 170 and pass the combined received signal through the third transmit/receive switch 158 to a low noise amplifier 160. The low noise amplifier 160 amplifies the received signal and passes it to an adjustable or "variable" phase shifter 162. The output of the variable phase shifter 162 is passed to a variable attenuator 164 that may be used to reduce the magnitude of the received signal. The output of the variable phase shifter 162 is passed to the second transmit/receive switch 150, which passes the signal to the filter 140.

The received signal is passed from the filter 140 to the second circulator 136 which routes the received signal to another low noise amplifier 138. The low noise amplifier 138 increases the level of the received signal to maintain an acceptable signal-to-noise ratio. The received signal is then passed through the first circulator 132 to the up/down converter 122, which uses the local oscillation signal to downconvert the received signal to an intermediate frequency (e.g., 2.0 GHz). This downconverted signal is passed through the first transmit/receive switch 120 to an analog-to-digital converter 112. A digital data stream output by the analog-to-digital converter 112 is passed to the baseband equipment 20.

As shown in FIGS. 1A-1B, in an example embodiment, each column of radiating elements 172 in the active antenna array 100 may be configured as a sub-array 170 that is connected to a respective one of the transmit/receive paths 102. In the depicted embodiment, the same transmit signal is fed to each radiating element 172 in a respective column/sub-array 170. In other embodiments, every radiating element 172 may include its own transmit/receive path 102 (i.e., adjustable attenuators 152, 164, adjustable phase shifters 154, 162, etc.) or different subsets of the radiating elements 172 may have their own transmit/receive path 102 (e.g., two paths may be provided per column of radiating elements 172, with each transmit/receive path 102 feeding four radiating elements 172).

Figure 1C:
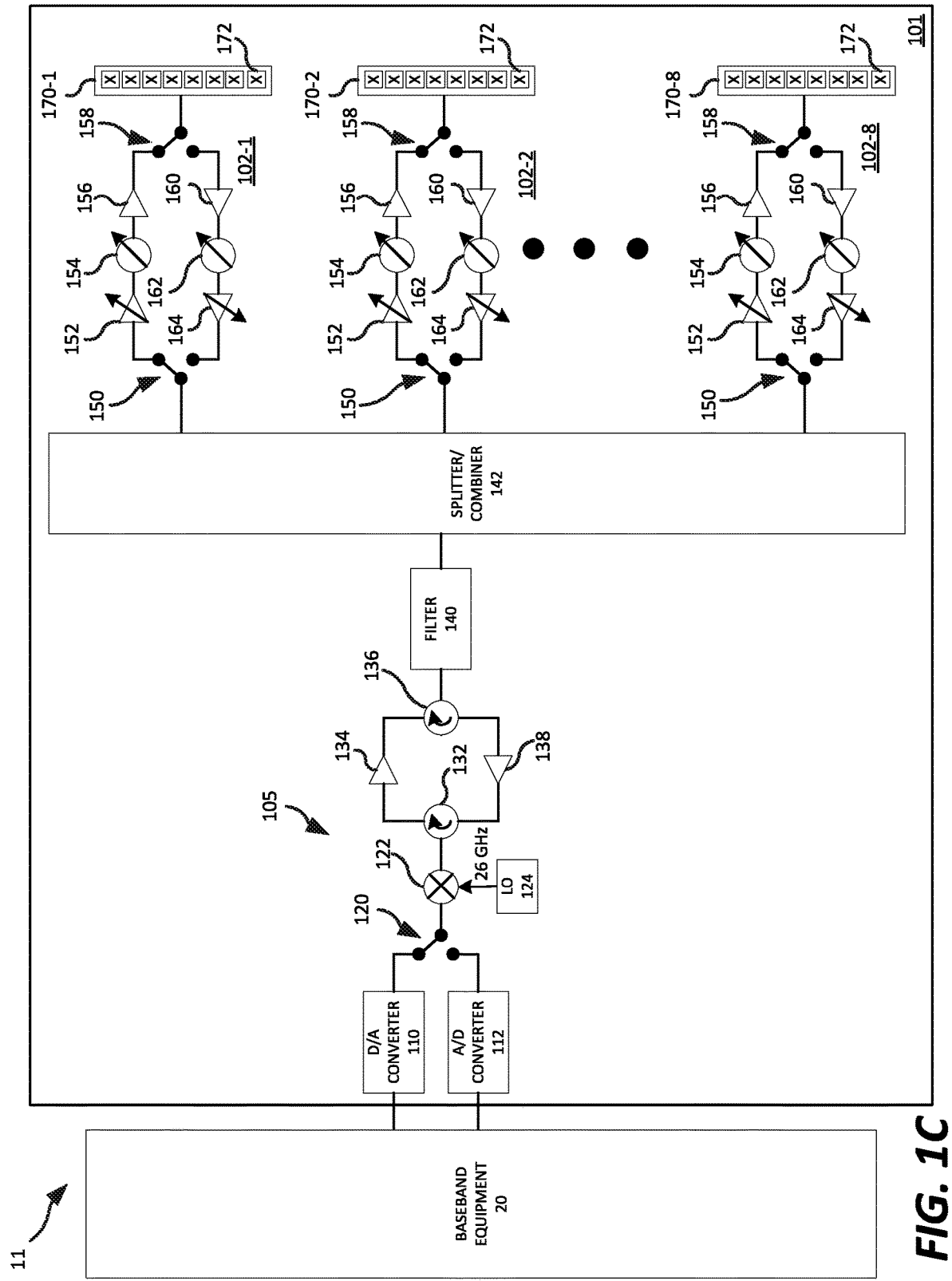
FIG. 1C is a schematic diagram of another millimeter wave communications system that includes an active antenna array that is configured for RF beamforming.

An alternative to the embodiment shown in FIG. 1A is to include a single transceiver (digital-to-analog converter 110 and analog-to-digital converter 112 up to filter 140) in the active antenna array and to use this transceiver to drive a splitter/combiner with each output/input of the splitter/combiner connected to transmit and receive path variable attenuators, phase shifters, and amplifiers that connect to each sub-array. A millimeter wave communications system 11 having this configuration is illustrated in FIG. 1C. As can be seen; in the millimeter wave communications system 11 of FIG. 1C, the active antenna array 101 included therein has a single transceiver 105 that feeds a splitter/combiner 142 that divides RF signals to be transmitted into eight separate sub-components that are then passed to the transmit path variable attenuators and phase shifters 152, 154. The splitter/combiner 142 likewise combines RF signals received at each of the eight sub-arrays 170 (after they are passed through the receive path variable attenuators and phase shifters 162, 164) and feeds the combined received signal to the transceiver 105. This embodiment is more cost-effective at millimeter wave frequencies due to the high cost of the transceiver 105 at these frequencies.

Active antenna arrays in which the magnitude and phase of the sub-components of an RF signal to be transmitted can be individually adjusted are known in the art. As discussed above, these antennas need to be calibrated to adjust for mismatches in the components that can degrade performance. For example, if the adjustable phase shifters included in an active antenna array have errors on the order of +/−5°, the actual antenna beams that are formed by the active antenna array will not coherently combine nearly as well in practice as the antenna beam predicted by a beamforming algorithm used to set the adjustable attenuators and phase shifters of the active antenna array. As a result, the peak gain of the antenna beam may be lower than expected; the pointing direction of the peak gain (the antenna beam pointing direction) may be different by, for example, a few degrees (or more) from a desired antenna beam pointing direction, and/or sidelobes of the antenna beam may be larger than necessary. By calibrating the active antenna array to reduce or eliminate these mismatches between the desired amplitude and phase adjustments and the actual adjustments, the performance of the active antenna array may be significantly improved.

In a conventional active antenna array that operates at traditional cellular communications frequencies (e.g., in the 600 MHz to 2.7 GHz frequency range), the calibration process may be performed in a straightforward manner. For example, a splitter/combiner may be included along the transmit/receive path to each radiating element (or sub-array of radiating elements). The splitter/combiner may be configured to pass a small part of the transmitted or received signal energy to a tap port of the splitter/combiner. The splitter/combiner tap ports may be connectorized, and these connectorized tap ports may be connected to test equipment. A known test signal may then be transmitted through the conventional active antenna array, and the test equipment may measure the amplitude and phase of the sub-components of the signal that are output at each tap port of the splitter/combiners, which correspond to the magnitudes and phases of the sub-components of the signal that are supplied to each radiating element (or sub-array of radiating elements). The measured amplitude and phases may then be compared to the intended magnitudes and phases to determine the mismatches along each transmission path. Typically, a variety of different known test signals would be transmitted through the base station antenna, and the mismatches would be determined for each of these test signals, as the mismatches tend to not be static but instead may vary depending upon the amounts of the phase shifts along each transmission path. A calibration table may then be generated that specifies the settings for the adjustable attenuators and phase shifters along each transmission path that will result in different amounts of attenuation and phase shift.

Unfortunately, the calibration techniques used for active antenna arrays that operate at frequencies below, for example, the 3 GHz frequency range may not be readily applicable to millimeter wave active antenna arrays. As discussed above, at millimeter wave frequencies, the radiating elements may be much smaller and may be mounted on the same mounting substrate as the active equipment. When implemented in this manner, the radiating elements are typically fed by transmission lines formed on the mounting substrate. While directional couplers could be implemented along each such transmission line to tap off a portion of the signal energy for calibration purposes, it is generally difficult to make connections (using, for example, cables and connectors) from the tap port to test equipment, as the small size of the device does not readily allow for the large number of connectors that would be required to connect each tap port to test equipment over such cabling connections. Moreover, as the signal wavelength is very small at millimeter wave frequencies, errors in phase measurement may be introduced during the calibration process. As such, conventional calibration techniques may not be practical for many millimeter wave active antenna arrays.

Pursuant to embodiments of the present invention, methods for calibrating millimeter wave active antenna arrays are provided. Pursuant to these methods, test signals are transmitted through the millimeter wave active antenna array in an anechoic chamber and over-the-air measurements are made of the power of the received signal at various locations (i.e., over a range of different locations corresponding to different azimuth and elevation angles from the boresight of the active antenna array). For each location, one or more optimization algorithms may be used to determine the adjustments to make to the variable phase shifter and attenuator settings for each radiating element that optimize performance of the active antenna array.

Figure 2:
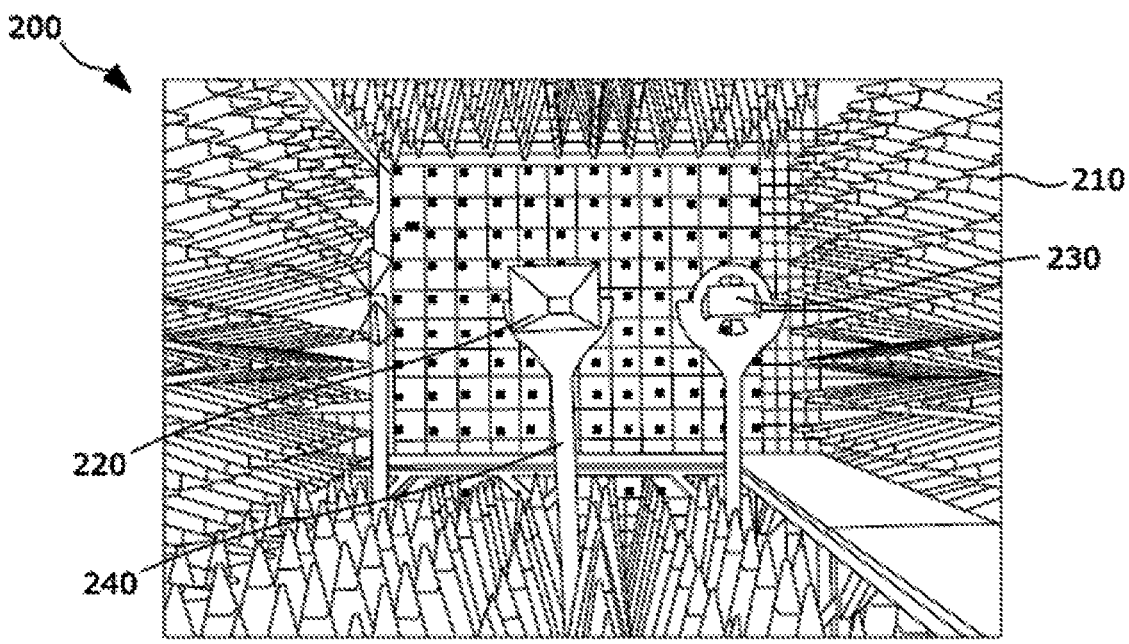
FIG. 2 is a schematic diagram of a test chamber.

FIG. 2 is a schematic diagram illustrating an anechoic test chamber 200 that may be used to calibrate millimeter wave active antenna arrays pursuant to test methods according to embodiments of the present invention. As shown in FIG. 2, the test chamber 200 may comprise an enclosed room that includes RF shielding to substantially reduce or prevent RF energy from the outside to pass into the room during antenna testing. The walls, floor and ceiling of the test chamber 200 may be covered with microwave absorbing materials 210 that scatter or absorb enough of the RF radiation emitted by an antenna under test 220 such that the test chamber 200 will simulate free space transmissions. The antenna under test 220 may comprise, for example, the active antenna array 100 of FIGS. 1A-1B. The test chamber 200 may be used to measure the RF emissions from the antenna under test 220 at short distances (e.g., 10 meters or less) without interference from external RF emissions or noise. The antenna under test 220 may be mounted on a rotatable antenna mount 240 in some embodiments so that it may be readily switched to have different boresight pointing directions. The rotatable antenna mount 250 may also have height adjustment capabilities to mount the antenna under test 220 at different heights above the floor of the chamber 210.

As is further shown in FIG. 2, one or more antennas 230 may be mounted in the test chamber 200. The antenna 230 may comprise, for example, a horn antenna in some embodiments. Test equipment (not shown) may be connected to the antenna 230 to measure characteristics of signals received during a test of the active antenna array under test 220. The test equipment may include a receiver.

The test chamber 200 of FIG. 2 may be used to calibrate a millimeter wave active antenna 220 under test as follows. The receive antenna 230 is positioned at a first direction (i.e., azimuth and elevation pointing angles) with respect to the boresight pointing direction of the active antenna array under test 220. A series of test signals are transmitted through the active antenna array 220. The magnitudes and phases of the test signals are adjusted in an effort to optimize (i.e., maximize) the signal power received at the receive antenna 230. In an example embodiment, the active antenna array under test 220 may be configured during the transmission of the first test signal to have each radiating element set at magnitude and phase values that theoretically should create an antenna beam that is pointed directly at the receive antenna 230 (i.e., the highest gain in the antenna pattern is at the azimuth and elevation angles of the receive antenna 230). The magnitude and/or phase settings along each transmission path may then be modified during the transmission of the second and subsequent test signals. An optimization algorithm may be used to select the magnitude and phase settings for each test signal. The optimization algorithm may facilitate much more quickly identifying a set of magnitude and phase settings that increase the transmit power level in a selected direction as compared to if no calibration was performed, and may typically substantially maximize the transmit or receive power. The optimization algorithm may identify the set of magnitude and phase settings that correspond to the received test signal having the highest power level as the optimum magnitude and phase settings. This process may be performed for a wide range of antenna beam directions (e.g., in 2° steps in both the azimuth and elevation directions throughout the field of view of the active antenna array). The actual settings for the adjustable attenuators and phase shifters that were used to generate the received test signal having the highest received power for a given antenna beam direction may be input to a calibration table as the attenuator and phase shifter settings to use when transmitting to a user located in that direction.

The above-described test signals are transmitted and received inside an anechoic chamber to reduce or eliminate the effect of spurious reflections or external RF noise. The receiver is located far enough away from the active antenna array to clearly be in the far field in order to accurately mimic actual performance when the active antenna array is deployed.

As noted above, optimization algorithms may be used to select the magnitude and phase settings used when transmitting the test signals for each antenna beam pointing direction. These optimization algorithms may facilitate more quickly identifying an optimum (or near optimum) solution where the adjustable attenuator and phase shifter settings are determined that maximize the receive power at the receive antenna 230. A variety of suitable optimization algorithms exist that could be used. As one example, a conjugate gradient optimization algorithm could be used. A description of an example conjugate gradient optimization algorithm is provided in Magnus R. Hestenes and Eduard Stiefel, *Methods of Conjugate Gradients for Solving Linear Systems*, Journal of Research of the National Bureau of Standards, Vol. 49, No. 6, December 1952, pp. 409-436, the entire content of which is incorporated herein by reference. As another example, a particle swarm optimization algorithm could be used. A description of an example particle swarm optimization algorithm is provided in J. Kennedy and R. C. Eberhart, *Particle Swarm Optimization*, Proc. IEEE Conf. Neural Networks IV, Piscataway, N.J., 1995. As yet another example, a bat optimization algorithm could be used. A description of an example bat optimization algorithm is provided in X. S. Yang, *A New Metaheuristic Bat-Inspired Algorithm*, Nature Inspired Cooperative Strategies for Optimization (NISCO 2010), Eds. J. R. Gonzales et. al., Studies in Computational Intelligence, Springer Berlin, 284, Springer, 65-74 (2010).

In some embodiments, the magnitudes and phases may be optimized simultaneously. In other embodiments, the phase may be optimized first, followed by the magnitude, and in still other embodiments, the magnitude may be optimized first, followed by the phase. In each case the magnitude may be optimized with the constraint that the magnitude of a signal transmitted by any of the radiating elements in the active antenna array 220 may not exceed 1 (0 dB), which corresponds to the maximum rated power per antenna element. Optimizing the phase and magnitude together may, in some instances, achieve improved results, but also doubles the number of variables being optimized, which increases the convergence time as compared to optimizing the two parameters independently.

Figure 3:
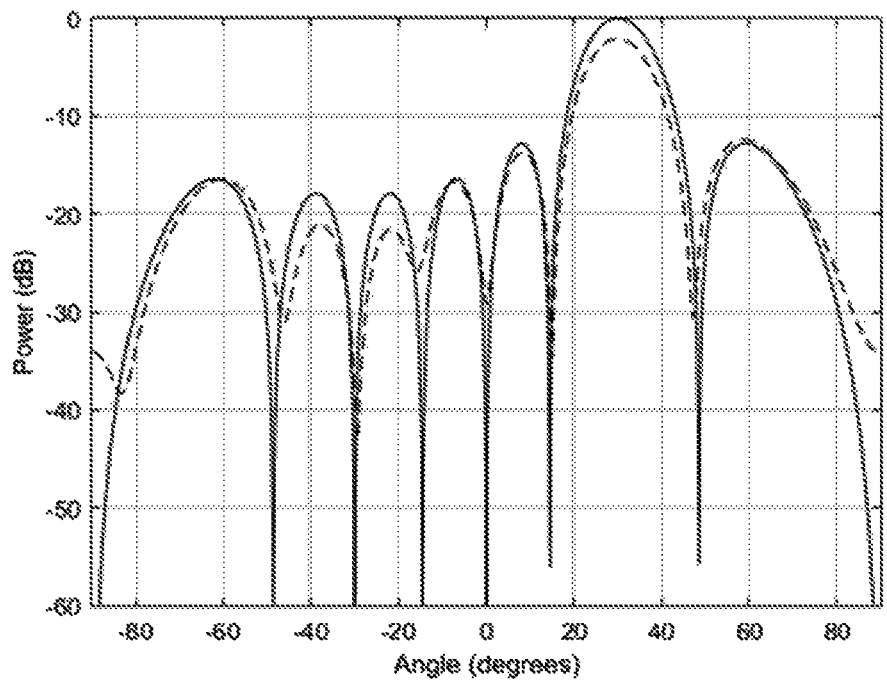
FIG. 3 is a graph illustrating the effect of phase and amplitude errors on the antenna pattern of an active antenna array.

FIG. 3 is a graph that illustrates the effect of phase and amplitude errors on the radiation pattern (antenna beam) of an active antenna array. In FIG. 3, the solid curve illustrates the calculated radiation pattern for an active array antenna that comprises a uniform linear array of eight radiating elements that are each spaced a half-wavelength apart, where the antenna beam is directed at 30° away from the boresight pointing direction of the active antenna array (i.e., the main lobe of the antenna beam is directed at an azimuth angle that is 30° from the boresight pointing direction of the active antenna array and at the same elevation angle). This calculated radiation pattern assumes that there are no magnitude or phase errors. The dashed curve in FIG. 3 illustrates the radiation pattern for the same antenna operating under identical conditions except that it is assumed that each radiating element had a normally-distributed random phase error in the range +/−5° and a normally distributed magnitude error in the range +/−2 dB. As can be seen by comparing the solid and dotted lines in FIG. 3, these magnitude and phase errors reduce the magnitude of the main beam by more than 2 dB, and increase the magnitude of the far sidelobes.

Figure 4:
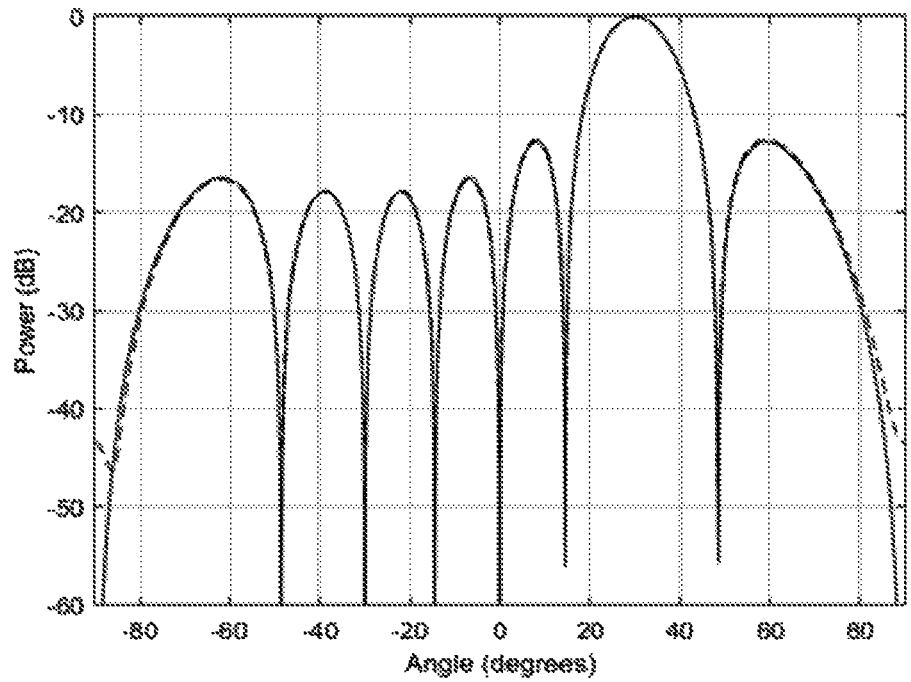
FIG. 4 is a graph illustrating how the calibration techniques according to embodiments of the present invention may reduce the effects of magnitude and phase errors.

FIG. 4 is a graph that illustrates the effect of phase and amplitude errors and how the calibration techniques according to embodiments of the present invention may reduce these effects. The solid curve in FIG. 4 is the same as the solid curve from FIG. 3, and again shows the calculated radiation pattern assuming that there are no magnitude or phase errors. The dashed curve in FIG. 4 illustrates the radiation pattern after a bat optimization algorithm was used to calibrate the active antenna array to account for magnitude and phase errors. Since the bat algorithm used seeks to minimize the parameter being optimized (the cost function), the negative of the power in the desired pointing direction for the main beam of the antenna pattern was used as the cost function in applying the optimization algorithm. As can be seen, the calibration essentially eliminates the reduction in the main lobe of the antenna beam, as well as the increase in the outer sidelobes. It can be seen that after calibration the radiation pattern is nearly identical to the calculated pattern. Thus, optimizing a single parameter, namely the maximum power of the received signal in the desired beam-pointing direction, results in the entire radiation pattern being optimized. The power can be measured with low variance, using averaging if necessary, which enables the residual errors after optimization to be negligibly small. Moreover, measuring the absolute power is not necessary since only relative values are needed for the optimization algorithm.

The above process may be repeated for all azimuth and elevation pointing angles for the main lobe (with respect to the boresight pointing direction of the active antenna array), as the errors in magnitude and phase may vary with respect to the magnitude of the phase shifts. Typically, calibration will be performed in steps such as, for example, two degree steps in azimuth and elevation angle. Interpolation of the data in the calibration table may be used for pointing directions that are between the pointing directions used in the calibration process.

While in the above description, calibration was performed by optimizing the received power in the desired pointing direction, it will be appreciated that other parameters may be optimized. For example, in other embodiments, the receiver may be placed at the location where a null in the radiation pattern is desired, and the optimization algorithm may be used to reduce and/or minimize the received power. Minimizing the received power in a certain direction can be used to counter interference received from that direction.

The above-described process may be used to calibrate an active antenna array in a factory setting. Pursuant to further embodiments of the present invention, similar procedures may be used in the field during normal operation of an active antenna array to correct for changes in the phase and magnitude errors that occur with changes in temperature, particularly in applications such as fixed wireless applications where the users are always at the same physical location. In this case, the active antenna array may be programmed to occasionally or periodically send a series of test signals to each receiver that the active antenna array communicates with during periods when there is extra bandwidth on the link. The above-described optimization procedures may be used to select the test signals. The receiver may be designed to transmit the received signal level (or other parameters) back to the active antenna array for each test signal. Based on this information, the active antenna array may use an optimization algorithm to generate and transmit a new test signal that has different amplitude and phase settings. This process may repeat until the algorithm is completed. The magnitude and phase settings providing, for example, the maximum received power at the receiver may then be stored in the calibration table and used for transmitting (and receiving) signals to this particular receiver until a subsequent calibration test is performed for this receiver. In this fashion, changes in the operating characteristics of the active antenna array 100 that arise due to temperature changes, time drift and the like may be actively corrected. One significant advantage of such an approach is that it may eliminate the need to repeat the above-described factory calibration tests over a range of temperatures, which may be a time consuming and costly operation.

As described above, conventional active antenna array calibration techniques typically require the addition of components such as monitoring antennas, couplers, and transceivers, all of which add cost and bulk to the active antenna array. The calibration techniques described herein may reduce or minimize the size and cost of the active antenna array. While some calibration testing may be required, in the factory and/or in the field, the use of optimization algorithms may reduce the complexity of the testing, and in some embodiments the testing may be automated and performed solely in the field by simply programming the active antenna array to perform the test routine and programming the receiver to, for example, measure the magnitude of the test signals and transmit such received power information back to the active antenna array.

It will be appreciated that the active antennas according to embodiments of the present invention may include a controller that generates control signals that are used to set the adjustable attenuators and phase shifters to respective magnitude and phase settings that may be stored in, for example, a calibration table. For ease of convenience, the discussion above sometimes refers to applying magnitude and phase settings to the active antenna array. It will be appreciated that, at least in some embodiments, in practice these magnitude and phase settings are applied to the active antenna array by transmitting control signals to the adjustable attenuators and phase shifters that cause the attenuators and phase shifters to apply selected attenuation levels and phase shifts.

Figure 5:
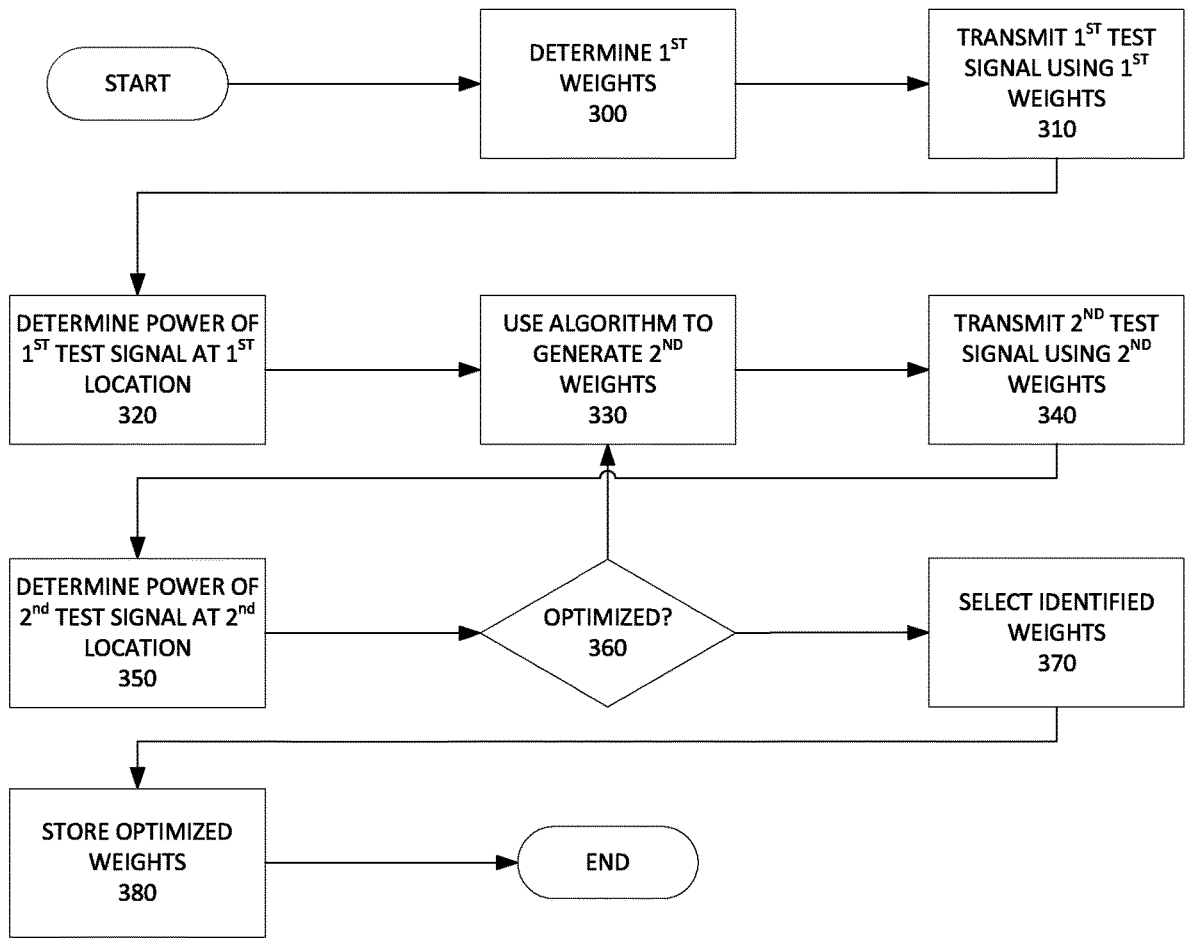
FIG. 5 is a flow chart diagram illustrating a method of calibrating an active antenna array according to embodiments of the present invention.

FIG. 5 is a flow chart diagram illustrating a method of calibrating an active antenna array according to embodiments of the present invention. As shown in FIG. 5, operations may begin with first magnitude and phase settings (or "weights") for each of a plurality of sub-arrays of the active antenna array being determined (Block 300). The first magnitude and phase settings may be configured to generate an antenna pattern having a main lobe that points in a first direction with respect to a boresight pointing direction of the active antenna array. A first millimeter wave signal is then transmitted through the active antenna array using the first set of magnitude and phase settings (Block 310). A received power of the transmitted first millimeter wave signal at a first location is then determined (Block 320). An optimization algorithm is then used to determine second magnitude and phase settings for exciting the plurality of sub-arrays of the active antenna array (Block 330). A second millimeter wave signal is then transmitted through the active antenna array using the second magnitude and phase settings (Block 340). A received power of the second transmitted millimeter wave signal at a second location is then determined (Block 350). The second location is typically the same as the first location, although it need not be in all cases.

A determination may then be made as to whether the optimization algorithm has been completed (Block 360). If it has, the set of magnitude and phase settings identified by the optimization algorithm that optimizes performance is selected as the magnitude and phase settings for generating an antenna beam that points in the first direction (Block 370). This set of magnitude and phase settings may then be stored in, for example, a calibration table in a memory of the active antenna array (Block 380), and operations may end. If at Block 360 it is determined that the optimization algorithm has not been completed, then operations may return to Block 330 where a new set of magnitude and phase settings for exciting the plurality of sub-arrays of the active antenna array is determined.

In some cases, the first location may be a location along a direction with respect to a boresight pointing direction of the active antenna array that corresponds to the pointing direction of the main lobe in the absence of calibration errors. In other words, the first location may be located in a direction from the boresight pointing direction of the active antenna array where the received power should have a maximum power level (as compared to any other direction). However, due to mismatches in the components along the transmit/receive paths 102, the received power level at the first location will be less than predicted. The optimization algorithm is used to relatively quickly identify a modified set of magnitude and phase settings that compensates for the mismatches so that signals transmitted by the active antenna array will have higher received power levels at the first location.

In other embodiments, the first location may not be along the vector extending from the active antenna array along the first direction but instead may be in a different location such as, for example, a location that is in a direction where a null in the antenna pattern is desired. In these embodiments, the optimization algorithm may be configured to select magnitude and phase settings for each of the plurality of sub-arrays of the active antenna array that decrease the received power of millimeter wave signals transmitted by the active antenna array at the first location.

The optimization algorithm may continue to be used to determine additional sets of magnitude and phase settings for each of the plurality of sub-arrays of the active antenna array, and for each of the additional sets of magnitudes and phases, transmitting an additional millimeter wave signal through the active antenna array that is generated using the additional set of magnitude and phase settings and determining the received power from each additional transmitted millimeter wave signal at the receiver in order to identify a set of magnitude and phase settings that either maximize or minimize a received power level of millimeter wave signals transmitted from the active antenna array at locations along the first direction.

Figure 6:
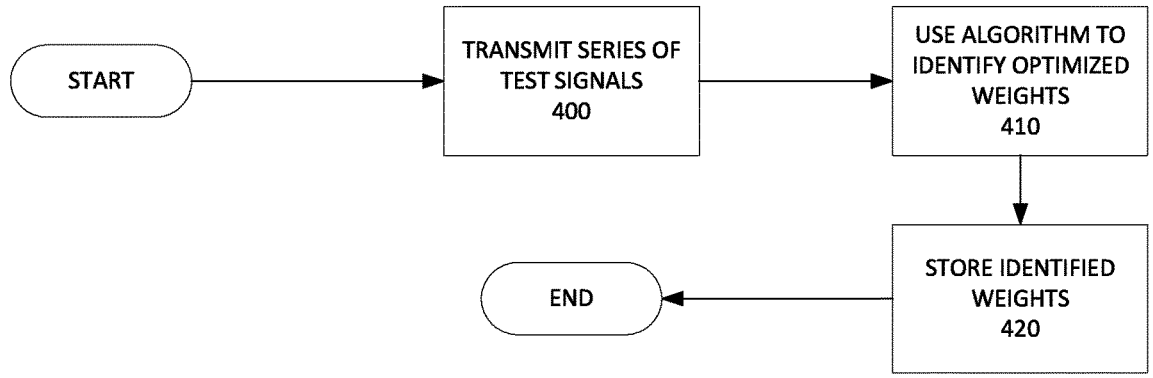
FIG. 6 is a flow chart diagram illustrating a method of calibrating an active antenna array according to further embodiments of the present invention.

FIG. 6 is a flow chart diagram illustrating a method of calibrating an active antenna array according to still further embodiments of the present invention. As shown in FIG. 6, a series of test millimeter wave signals is transmitted through the active antenna array that are received at a receiver that is located in a fixed relationship with respect to the active antenna array (Block 400). An optimization algorithm is used to select at least some of a plurality of magnitude and/or phase settings that are applied to sub-components of the test millimeter wave signals that are transmitted through the active antenna array (Block 410). The optimization algorithm is configured to identify magnitude and/or phase settings that either maximize or minimize a received power level of a millimeter wave signal that is transmitted by the active antenna array at a location of the receiver. The identified magnitude and phase settings may then be stored in a calibration table in an appropriate format for controlling the active antenna array to apply these magnitude and phase weights when the active antenna array is transmitting or receiving signals in the direction of the receiver (Block 420).

Figure 7:
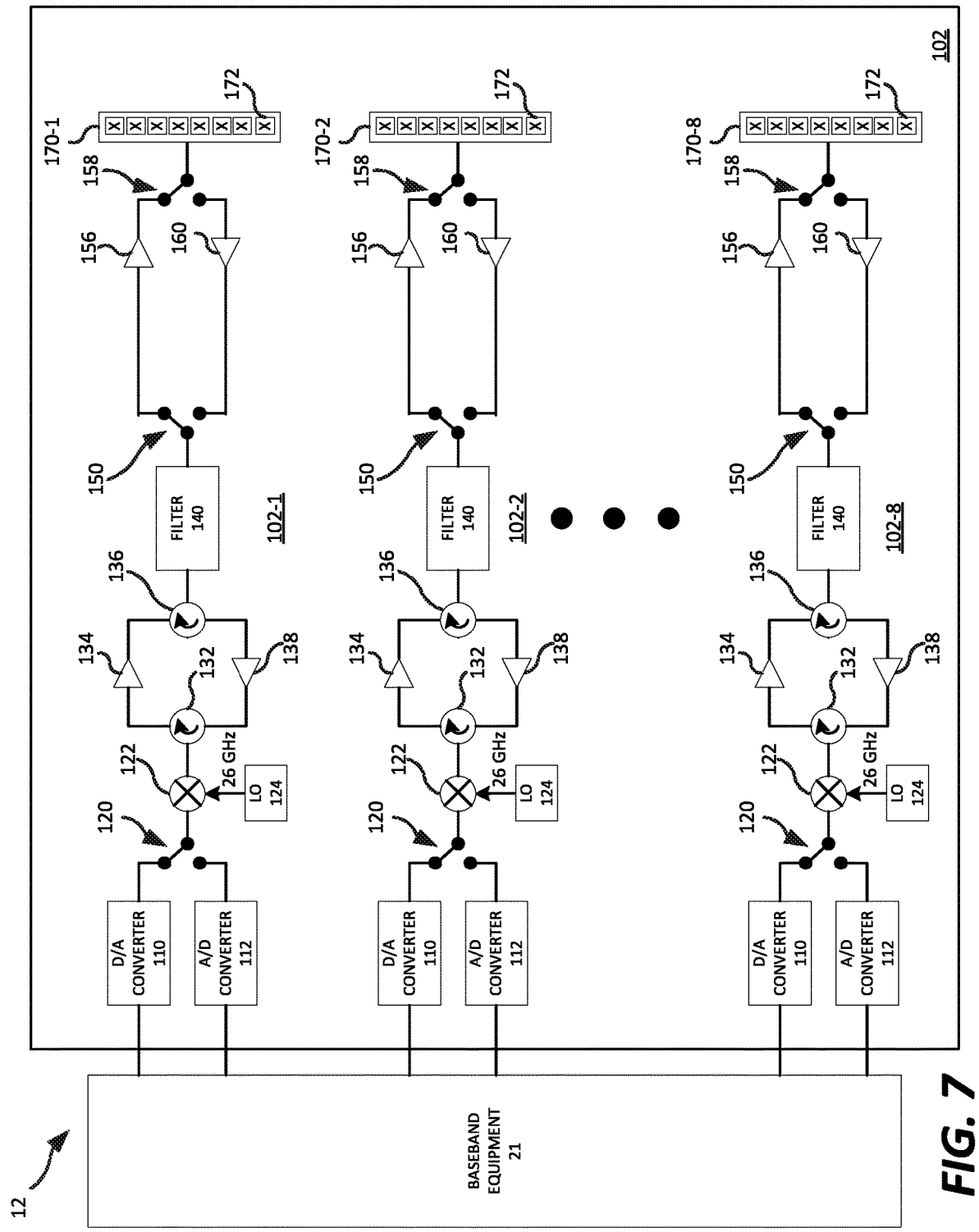
FIG. 7 is a schematic diagram of an active antenna array according to embodiments of the present invention that is configured for baseband beamforming.

In the active antenna array 100 described above with reference to FIGS. 1A-1B, the phase and amplitude adjustments are made at RF. It will be appreciated that the calibration techniques disclosed herein may also be used with respect to active antenna arrays that perform phase and amplitude adjustments digitally in the baseband equipment. FIG. 7 is a schematic diagram of a millimeter wave communication system 12 that includes an active antenna array 102 that performs baseband beamforming. As can be seen by comparing FIG. 7 to FIG. 1A, the primary difference is that the adjustable phase shifters 152, 164 and adjustable attenuators 154, 162 are omitted in the active antenna array 102, and instead the magnitude and phase adjustments are made by the baseband equipment 21. It will likewise be appreciated that the techniques disclosed herein can be used with active antenna arrays that perform beamforming at an intermediate frequency or that use hybrid approaches where beamforming is partially performed at baseband and partially at RF or an intermediate frequency.

It will also be appreciated that the above-described calibration techniques may be performed for both the transmit and receive paths, as the variations may be different along each path.

The calibration procedure for the receive path may be similar to the above-described calibration procedure for the transmit path. For example, in some embodiments, the test chamber 200 of FIG. 2 may be used to calibrate the receive path of a millimeter wave active antenna 220 under test as follows. The antenna 230 is connected to a transmitter (not shown in FIG. 2) and is positioned along a first direction (i.e., azimuth and elevation pointing angles) with respect to the boresight pointing direction of the active antenna array 220. A series of test signals is transmitted through the antenna 230, and the power of each test signal received at the active antenna array 220 is measured. The magnitudes and phase settings along each receive path of the active antenna array 220 are adjusted in an effort to optimize (i.e., maximize) the signal power received at the active antenna array 220. In an example embodiment, the active antenna array 220 may be configured during the reception of the first test signal to have each radiating element set at magnitude and phase values that theoretically should create an antenna beam that is pointed directly at the antenna 230 (i.e., the highest gain in the antenna pattern is at the azimuth and elevation angles of the antenna 230). The magnitude and/or phase settings along each receive path may then be modified during the reception of the second and subsequent test signals. An optimization algorithm may be used to select the magnitude and phase settings used during the reception of each test signal. The optimization algorithm may facilitate much more quickly identifying a set of magnitude and phase settings that increase the power level of the received signal in a selected direction as compared to if no calibration was performed. The optimization algorithm may identify the set of magnitude and phase settings that correspond to the received test signal having the highest power level as the optimum magnitude and phase settings. This process may be performed for a wide range of antenna beam directions (e.g., in 2° steps in both the azimuth and elevation directions throughout the field of view of the active antenna array 200). It will also be understood that in other embodiments the optimization algorithm may be set to minimize the power of the received test signals. In such embodiments, only the phase may be adjusted (since the received signal power could also be minimized by setting the attenuators to fully attenuate the received signal).

Thus, in some embodiment, methods of calibrating an active antenna array are provided in which first magnitude and phase settings are determined for each of a plurality of sub-arrays of the active antenna array, where the first magnitude and phase settings are configured to generate a radiation pattern having a main lobe that points in a first direction with respect to a boresight pointing direction of the active antenna array. A first millimeter wave signal is received at the active antenna array using the first set of magnitude and phase settings, and a received power of the first millimeter wave signal is determined. An optimization algorithm is then used to determine second magnitude and phase settings for each of the plurality of sub-arrays of the active antenna array. A second millimeter wave signal is received at the active antenna array using the second magnitude and phase settings, and a received power of the second millimeter wave signal is determined. Both the first millimeter wave signal and the second millimeter wave signal may be transmitted to the active antenna array from a first location.

In some embodiments, the first location may be within the main lobe of the radiation pattern. In such embodiments, the optimization algorithm may be configured to identify a set of magnitude and phase settings for each of the plurality of sub-arrays of the active antenna array that increase the received power of millimeter wave signals received at the active antenna array from a source at the first location as compared to the determined received power of the first millimeter wave signal. In other embodiments, the first location may not be along a vector extending from the active antenna array along the first direction. In these embodiments, the optimization algorithm may be configured to identify a set of magnitude and phase settings for each of the plurality of sub-arrays of the active antenna array that decrease the power of millimeter wave signals received at the active antenna array from a source at the first location as compared to the determined received power of the first millimeter wave signal.

The optimization algorithm may be used to determine additional sets of magnitude and phase settings, each additional set including magnitude and phase settings for each of the plurality of sub-arrays of the active antenna array. For each of the additional sets of magnitude and phase settings, an additional millimeter wave signal that is transmitted from the first location is received at the active antenna array using the additional set of magnitude and phase settings, and the received power of each such additional received millimeter wave signal is determined. The set of magnitude and phase settings corresponding to the one of the additional received millimeter wave signals that has the highest or lowest received power level may be identified as the set of magnitude and phase settings to use when receiving signals from sources along the first direction.

The use of a particle swarm optimization algorithm is described in U.S. Pat. No. 9,553,363 ("the '363 patent"). However, in the '363 patent, the optimization algorithm is used to compensate for the failure, or the anticipated failure, of radiating elements or other components of the system as opposed to using the optimization algorithm to determine calibration. Additionally, in the '363 patent, the optimization algorithm uses as a cost function one of a maximum side lobe level, an average side lobe level, a cumulative difference, a beam width, or a pointing accuracy. In contrast, in example embodiments of the present invention the optimization algorithms are used to calibrate the active antenna array to reduce or eliminate the effects of mismatches in the transmit/receive paths, and beam power in a selected direction (e.g., the desired pointing direction) is used to optimize the entire radiation pattern.

In some embodiments, the active antenna array may perform full two-dimensional beam-forming in which the antenna beam may be steered in both the azimuth and elevation planes. In other embodiments, the active antenna array may perform one-dimensional beam-forming such as, for example, beam-forming in the azimuth plane only. The calibration techniques disclosed herein can be used with both types of active array antennas. In some embodiments, the active array antenna may comprise an active array antenna that performs beam-forming in the azimuth plane and that performs beamwidth switching in the elevation plane. Active array antennas having such designs are disclosed, for example, in U.S. Provisional Patent Application Ser. No. 62/506,100, filed May 15, 2017, the entire content of which is incorporated herein by reference as if set forth fully herein.

The present invention has been described above with reference to the accompanying drawings. The invention is not limited to the illustrated embodiments; rather, these embodiments are intended to fully and completely disclose the invention to those skilled in this art. In the drawings, like numbers refer to like elements throughout. Thicknesses and dimensions of some elements may not be to scale.

Spatially relative terms, such as "under", "below", "lower", "over", "upper", "top", "bottom" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" or "beneath" other elements or features would then be oriented "over" the other elements or features. Thus, the exemplary term "under" can encompass both an orientation of over and under. The device may be otherwise oriented (rotated 90 degrees or at other orientations) and the spatially relative descriptors used herein interpreted accordingly.

Well-known functions or constructions may not be described in detail for brevity and/or clarity. As used herein the expression "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention.

That which is claimed is:

1. A method of calibrating an active antenna array, the method, comprising:
   determining first magnitude and phase settings for each of a plurality of sub-arrays of the active antenna array wherein the first magnitude and phase settings are configured to generate a radiation pattern having a main lobe that points in a first direction with respect to a boresight pointing direction of the active antenna array;
   transmitting a first millimeter wave signal through the active antenna array using the first set of magnitude and phase settings;
   determining a received power of the transmitted first millimeter wave signal at a first location;
   using an optimization algorithm to determine second magnitude and phase settings for each of the plurality of sub-arrays of the active antenna array;
   transmitting a second millimeter wave signal through the active antenna array using the second magnitude and phase settings; and
   determining a received power of the transmitted second millimeter wave signal at a second location.

2. The method of claim 1, wherein the first location is within the main lobe of the radiation pattern.

3. The method of claim 2, wherein the second location is the same as the first location.

4. The method of claim 3, wherein the optimization algorithm is configured to identify a set of magnitude and phase settings for each of the plurality of sub-arrays of the active antenna array that increase the received power of millimeter wave signals transmitted by the active antenna array at the first location as compared to the determined received power of the first millimeter wave signal.

5. The method of claim 1, wherein the first location is not along a vector extending from the active antenna array along the first direction.

6. The method of claim 5, wherein the first location is in a direction of a desired null in the radiation pattern.

7. The method of claim 5, wherein the optimization algorithm is configured to identify a set of magnitude and phase settings for each of the plurality of sub-arrays of the active antenna array that decrease the received power of millimeter wave signals transmitted by the active antenna array at the first location as compared to the determined received power of the first millimeter wave signal.

8. A method of field calibrating an active antenna array, the method comprising:
   determining first magnitude and phase settings for each of a plurality of sub-arrays of the active antenna array that are configured to generate a radiation pattern having a main lobe that points in a first direction with respect to a boresight pointing direction of the active antenna array;

transmitting a first millimeter wave signal through the active antenna array using the first magnitude and phase settings;

receiving a first signal that includes a received power level of the first millimeter wave signal at a receiver;

using an optimization algorithm to determine second magnitude and phase settings for each of the plurality of sub-arrays of the active antenna array;

transmitting a second millimeter wave signal through the active antenna array using the second set of magnitude and phase settings; and receiving a second signal that includes a received power level of the second millimeter wave signal at the receiver; and continuing to use the optimization algorithm to determine additional sets of magnitude and phase settings, each additional set of magnitude and phase settings including magnitude and phase settings for each of the plurality of sub-arrays of the active antenna array, transmitting additional millimeter wave signals through the active antenna array using respective ones of the determined additional sets of magnitude and phase settings, and receiving additional signals from the receiver that include received power levels of the respective additional millimeter wave signals at the receiver until the optimization algorithm identifies a set of magnitude and phase settings for each of the plurality of sub-arrays of the active antenna array that maximize a received power level of millimeter wave signals transmitted by the active antenna array at the receiver.

9. The method of claim 8, wherein the optimization algorithm is configured to identify a set of magnitude and phase settings for each of the plurality of sub-arrays of the active antenna array that increase the received power of millimeter wave signals transmitted by the active antenna array at the receiver as compared to the determined received power of the first millimeter wave signal.

10. The method of claim 8, wherein the optimization algorithm is one of a conjugate gradient optimization algorithm, a particle swarm optimization algorithm or a bat optimization algorithm.

11. A method of calibrating an active antenna array, the method comprising:
transmitting a series of test millimeter wave signals through the active antenna array that are received at a receiver that is located in a fixed relationship with respect to the active antenna array, wherein an optimization algorithm is used to select at least some of a plurality of magnitude and/or phase settings that are applied to sub-components of the test millimeter wave signals that are transmitted through the active antenna array,
wherein the optimization algorithm is configured to identify magnitude and/or phase settings that either maximize or minimize a received power level of a millimeter wave signal that is transmitted by the active antenna array at a location of the receiver.

12. A method of calibrating an active antenna array, the method, comprising:
determining first magnitude and phase settings for each of a plurality of sub-arrays of the active antenna array wherein the first magnitude and phase settings are configured to generate a radiation pattern having a main lobe that points in a first direction with respect to a boresight pointing direction of the active antenna array;
receiving a first millimeter wave signal at the active antenna array using the first set of magnitude and phase settings;
determining a received power of the first millimeter wave signal;
using an optimization algorithm to determine second magnitude and phase settings for each of the plurality of sub-arrays of the active antenna array;
receiving a second millimeter wave signal at the active antenna array using the second magnitude and phase settings, where both the first millimeter wave signal and the second millimeter wave signal are transmitted to the active antenna array from a first location; and
determining a received power of the second millimeter wave signal.

13. The method of claim 12, wherein the first location is within the main lobe of the radiation pattern.

14. The method of claim 13, wherein the optimization algorithm is configured to identify a set of magnitude and phase settings for each of the plurality of sub-arrays of the active antenna array that increase the received power of millimeter wave signals received at the active antenna array from a source at the first location as compared to the determined received power of the first millimeter wave signal.

15. The method of claim 12, wherein the first location is not along a vector extending from the active antenna array along the first direction.

16. The method of claim 15, wherein the optimization algorithm is configured to identify a set of magnitude and phase settings for each of the plurality of sub-arrays of the active antenna array that decrease the power of millimeter wave signals received at the active antenna array from a source at the first location as compared to the determined received power of the first millimeter wave signal.

17. The method of claim 12, further comprising using the optimization algorithm to determine additional sets of magnitude and phase settings, each additional set including magnitude and phase settings for each of the plurality of sub-arrays of the active antenna array, and for each of the additional sets of magnitude and phase settings, receiving an additional millimeter wave signal that is transmitted from the first location at the active antenna array using the additional set of magnitude and phase settings and determining the received power of each additional received millimeter wave signal.

18. The method of claim 17, further comprising identifying the set of magnitude and phase settings corresponding to the one of the additional received millimeter wave signals that has the highest or lowest received power level.

* * * * *